United States Patent
Kao et al.

(10) Patent No.: US 10,438,730 B2
(45) Date of Patent: Oct. 8, 2019

(54) CURRENT SENSING RESISTOR AND FABRICATION METHOD THEREOF

(71) Applicant: CYNTEC CO., LTD., Hsinchu (TW)

(72) Inventors: Kuo-Tung Kao, Hsinchu (TW); Yang-Sheng Chou, Hsinchu (TW); Chieh-Yuan Feng, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 16/022,708

(22) Filed: Jun. 29, 2018

(65) Prior Publication Data

US 2019/0131038 A1     May 2, 2019

Related U.S. Application Data (60) Provisional application No. 62/579,861, filed on Oct. 31, 2017.

(51) Int. Cl.
| | |
|---|---|
| *H01C 1/14* | (2006.01) |
| *G01R 1/20* | (2006.01) |
| *H01C 17/28* | (2006.01) |
| *H01C 1/01* | (2006.01) |

(52) U.S. Cl.
CPC ............... *H01C 1/14* (2013.01); *G01R 1/203* (2013.01); *H01C 1/01* (2013.01); *H01C 17/28* (2013.01)

(58) Field of Classification Search
CPC . H01C 1/14; H01C 1/01; H01C 17/28; G01R 1/203
See application file for complete search history.

(56) References Cited

U.S. PATENT DOCUMENTS

| | | | |
|---|---|---|---|
| 3,578,895 A | 5/1971 | Caires | |
| 8,598,976 B2* | 12/2013 | Hetzler | G01R 1/203 338/322 |
| 9,305,687 B2 | 4/2016 | Cheng | |
| 10,157,698 B2* | 12/2018 | Nakamura | H01C 1/148 |
| 10,163,553 B2* | 12/2018 | Kameko | G01R 15/00 |

FOREIGN PATENT DOCUMENTS

| | | |
|---|---|---|
| CN | 1272945 A | 11/2000 |
| CN | 2588504 Y | 11/2003 |
| CN | 1265400 C | 7/2006 |
| CN | 102033152 A | 4/2011 |
| CN | 106574939 A | 4/2017 |
| CN | 103943289 B | 9/2017 |
| CN | 104078194 B | 10/2017 |
| TW | 201523652 A | 6/2015 |
| TW | 201606811 A | 2/2016 |
| TW | 201704760 A | 2/2017 |
| WO | 2012/019784 A1 | 2/2012 |
| WO | WO2016208453 A1 | 12/2016 |

OTHER PUBLICATIONS

Kameko et al., WO 2016208453 (Year: 2016).*

* cited by examiner

*Primary Examiner* — Kyung S Lee
(74) *Attorney, Agent, or Firm* — Winston Hu (57) ABSTRACT

A current sensing resistor includes a conductive body comprising a resistor portion and a pair of electrode portions connecting to two ends of the resistor portion, a receiving blind hole disposed on a top surface of each of the pair of electrode portions, and a detection terminal disposed on the receiving blind hole. The detection terminal includes a base fixed in the receiving blind hole and a terminal pin protruding from the top surface.

22 Claims, 8 Drawing Sheets

CURRENT SENSING RESISTOR AND FABRICATION METHOD THEREOF

CROSS REFERENCE TO RELATED APPLICATIONS

This application claims priority from U.S. provisional application No. 62/579,861 filed Oct. 31, 2017, the subject matter of which is hereby incorporated by reference.

BACKGROUND OF THE INVENTION

1. Field of the Invention

The present invention relates to a resistor device, and more particularly to a current sensing resistor with improved mechanical strength and better electrical performance.

2. Description of the Related Art

Current sensing resistors such as shunt resistors are known in the art. A current sensing resistor, when serially connected to a load and applied current thereto, results in a voltage drop which may be measured and referred to estimate the current intensity.

Current sensing resistors are used in various kinds of electrical equipment. Typically, a current sensing resistor comprises a metal plate resistor having a resistor body consisting of a metal material, which has a small temperature coefficient of resistance, and a pair of electrodes consisting of a metal material, which has high electrical conductivity, connected to both ends of the resistor body.

Typically, surface soldering processes are utilized in the manufacturing of the current sensing resistors. This method may cause the displacement of the detection terminal under the high temperature environment, resulting in variation of the resistance value and loss of detection accuracy.

Another method is coating solder on the electrodes on both sides of the current sensing resistor, then connecting to a printed circuit board (PCB) by surface mount technique (SMT). However, the high-temperature operation condition will lead to molten solder and resistance variation. There is also the risk of short circuiting the surrounding electronic components by directing heat to the circuit board.

SUMMARY OF THE INVENTION

It is one object of the present invention to provide a current sensing resistor with improved mechanical strength and better electrical performance.

According to one aspect of the invention, a current sensing resistor is disclosed. The current sensing resistor includes a conductive body comprising a resistor portion and a pair of electrode portions connecting to two ends of the resistor portion, a receiving blind hole disposed on a top surface of each of the pair of electrode portions, and a detection terminal disposed on the receiving blind hole. The detection terminal includes a base fixed in the receiving blind hole and a terminal pin protruding from the top surface.

According to one aspect of the invention, a method for fabricating a current sensing resistor is disclosed. A conductive body is provided. The conductive body includes a resistor portion and a pair of electrode portions. The resistor portion is situated between the pair of electrode portions, and each of the pair of electrode portions has a top surface. A receiving blind hole is formed on the top surface of each of the pair of electrode portions. A detection terminal is then inserted into the receiving blind hole. The detection terminal includes a base fitted in the receiving blind hole and a terminal pin protruding from the top surface. The base comprises a head portion and a neck portion between the terminal pin and the head portion. Each of the pair of electrode portions around the terminal pin is punched to form an extrusion portion encircling the neck portion. The extrusion portion clamps the head portion and the neck portion and fixes the base in the receiving blind hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The drawings showing embodiments of the apparatus are semi-diagrammatic and not to scale and, particularly, some of the dimensions are for the clarity of presentation and are shown exaggerated in the figures. Also, where multiple embodiments are disclosed and described having some features in common, for clarity and ease of illustration and description thereof like or similar features one to another will ordinarily be described with like reference numerals.

The present invention pertains to a current sensing resistor with improved mechanical strength and better electrical performance. The voltage detection terminal is made by joining copper pillars and is fixed at a specific position by a metal riveting method, which can avoid the risk of high-temperature solder melting problem and avoid the risk of position change. The strength of the voltage detection terminal meets the customer's requirements and can withstand long-term mechanical shocks. The width and thickness of the metal riveting can be adjusted to enhance the mechanical force.

Figure 1:
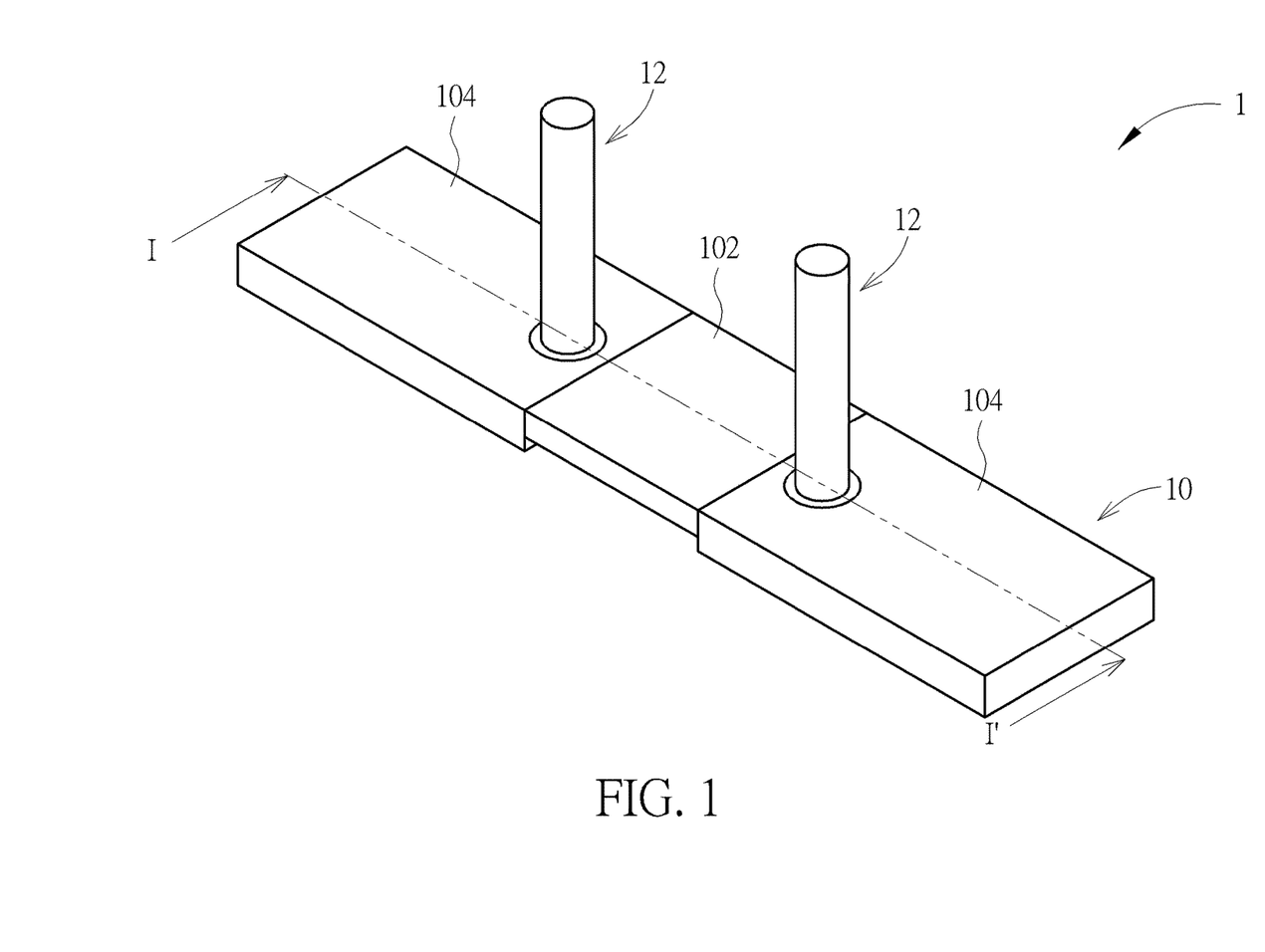
FIG. 1 is a schematic, perspective view of a current sensing resistor according to one embodiment of the invention.
Figure 2:
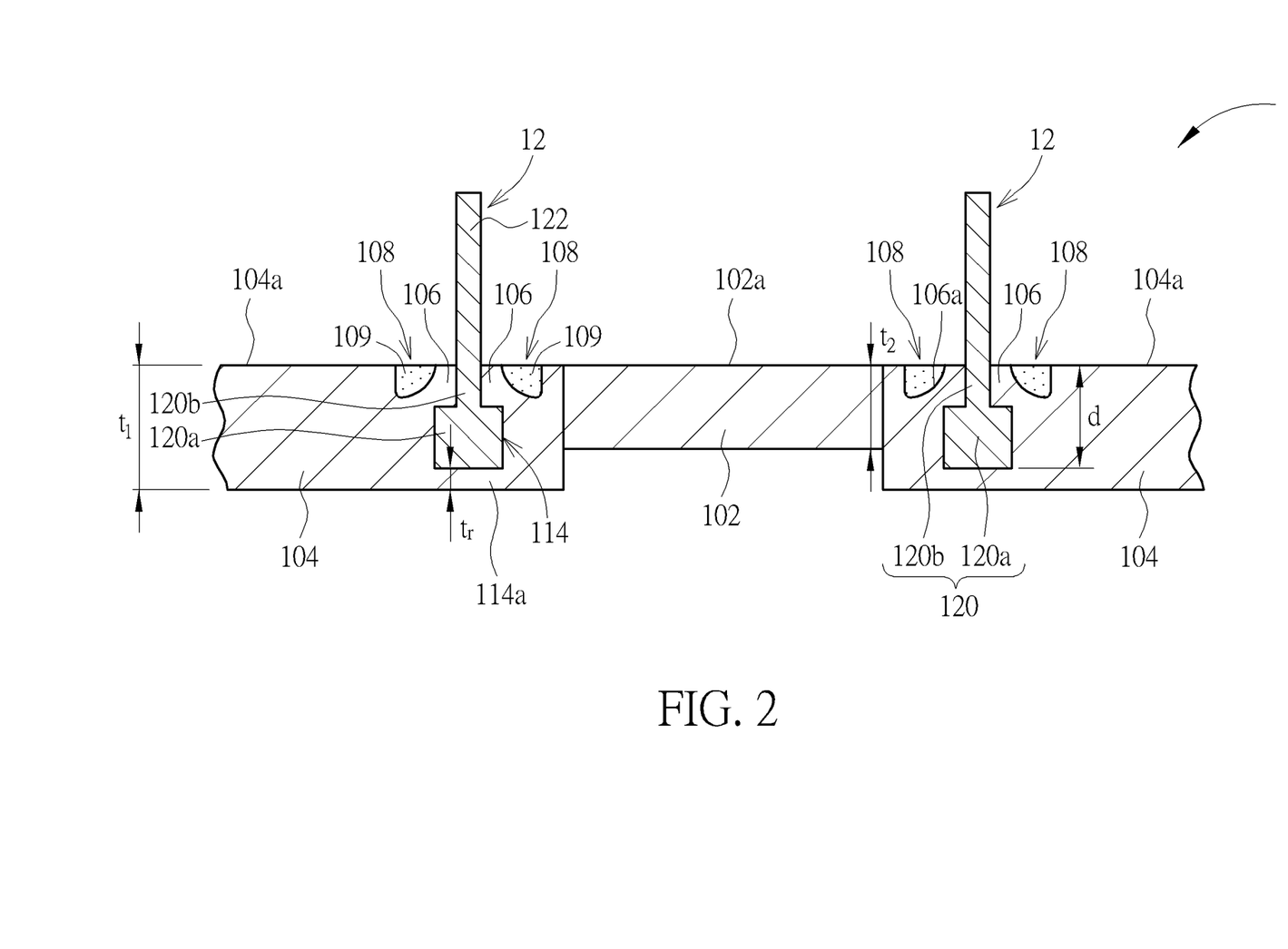
FIG. 2 is a schematic, cross-sectional view taken along line I-I' in FIG. 1.

Please refer to FIG. 1 and FIG. 2. FIG. 1 is a schematic, perspective view of a current sensing resistor according to one embodiment of the invention. FIG. 2 is a schematic, cross-sectional view taken along line I-I' in FIG. 1. As shown in FIG. 1 and FIG. 2, a current sensing resistor 1 is provided. The current sensing resistor 1 includes a conductive body 10. The conductive body 10 may comprise a resistor portion 102 and a pair of electrode portions 104. For example, the electrode portions 104 may comprise copper or copper alloys, but is not limited thereto.

According to one embodiment of the invention, the resistor portion 102 has two opposite end surfaces, and the pair of electrode portions 104 is connected to the two opposite end surfaces. According to one embodiment of the invention, a thickness $t_1$ of the pair of electrode portions 104 is greater than a thickness $t_2$ of the resistor portion 102, but is not limited thereto. According to one embodiment of the invention, the resistor portion 102 has a top surface 102a and each of the electrode portions 104 has a top surface 104a. According to one embodiment of the invention, the top surface 102a is flush with the top surface 104a.

According to one embodiment of the invention, a receiving blind hole 114 having a depth d is disposed on the top surface 104a of each of the pair of electrode portions 104. The receiving blind hole 114 has a bottom 114a. A detection terminal 12 such as a monolithic copper pin is disposed on and in the receiving blind hole 114. According to one embodiment of the invention, the detection terminal 12 may be a voltage detection terminal.

According to one embodiment of the invention, the electrode portion 104 has a remaining thickness $t_r$ at the bottom 114a of the receiving blind hole 114. The combination of the remaining thickness $t_r$ and the depth d is equal to the thickness $t_1$. According to one embodiment of the invention, a ratio of the remaining thickness $t_r$ to the thickness $t_1$ of the pair of electrode portions 104 may range between ½ and ⅛.

According to one embodiment of the invention, the detection terminal 12 includes a base 120 embedded and closely fixed in the receiving blind hole 114 and a terminal pin 122 protruding from the top surface 104a of the electrode portions 104. The base 120 is in direct contact with the bottom 114a of the receiving blind hole 114.

According to one embodiment of the invention, the detection terminal 12 may comprise copper or any suitable metal or metal alloys. According to one embodiment of the invention, the detection terminal 12 may have hardness that is greater than that of each of the pair of electrode portions 104.

In order to meet the requirements of the mechanical strength of the current sensing resistor 1, a certain hardness level of the detection terminal 12 is required. According to one embodiment of the invention, the Vickers hardness of the detection terminal 12 needs to be greater than 60 Hv tested by Vickers hardness tester under a downward force of 0.05 kg, to achieve the overall strength of the current sensing resistor 1.

According to one embodiment of the invention, the base 120 comprises a head portion 120a and a neck portion 120b between the terminal pin 122 and the head portion 120a. According to one embodiment of the invention, the head portion 120a may have a diameter greater than that of the neck portion 120b. For example, the neck portion 120b may have a diameter of about 1 mm and the head portion 120a may have a diameter of about 1~2 mm. The shape of the head portion 120a may form a tight fit corresponding to the shape of the receiving blind hole 114, for example, a circle to circle, a hexagon to a hexagon, or a hexagon to a circle, but is not limited thereto.

The following two situations may be considered when determining the preferable ratio of the height of the head portion 120a of the detection terminal 12 to the blind hole depth d: (a) If the height of the head portion 120a is greater than or equal to the blind hole depth d, and protruding from the receiving blind hole 114, after riveting the periphery of the detection terminal 12, a closely-fitting and clamping configuration is formed; (b) If the height of the head portion 120a is less than the depth d of the receiving blind hole 114, the entire head portion 120a is located within the receiving blind hole 114, and the electrode 104 on the periphery of the detection terminal 12 is riveted to form the snap fit. In this case, the ratio of the height of the head portion 120a to the depth d of the receiving blind hole 114 may be between ½ to ⅛, or the distance between the upper surface of the head portion 120a and the upper surface of the electrode 104 is between 0.1 and 2.0 mm.

According to one embodiment of the invention, the conductive body 10 further comprises an extrusion portion 106 extending from each of the pair of electrode portions 104. The extrusion portion 106 covers a part of the head portion 120 to closely fix the base 120a in the receiving blind hole 114. According to one embodiment of the invention, the extrusion portion 106 encircles the neck portion 120b.

According to one embodiment of the invention, the extrusion portion 106 may comprise an upper surface 106a including a raised surface that is upwardly tapered toward the neck portion 120b or the terminal pin 122. According to one embodiment of the invention, the extrusion portion 106 may comprise an upper surface 106a including a concave surface. According to one embodiment of the invention, the upper surface 106a may include a non-smooth surface. For example, the upper surface 106a may be subjected to surface treatments to provide desired surface roughness.

According to one embodiment of the invention, the conductive body 10 may further comprise an annular recessed region 108 around the extrusion portion 106. According to one embodiment of the invention, the annular recessed region 108a may be filled with a filler 109. According to one embodiment of the invention, the filler 109 may comprise solder, but is not limited thereto. According to one embodiment of the invention, nickel and tin are used as the caulking material to coat around the detection terminal 12 and to cover the periphery of the detection terminal 12 by soldering so as to increase the mechanical strength and conductivity.

Figure 3:
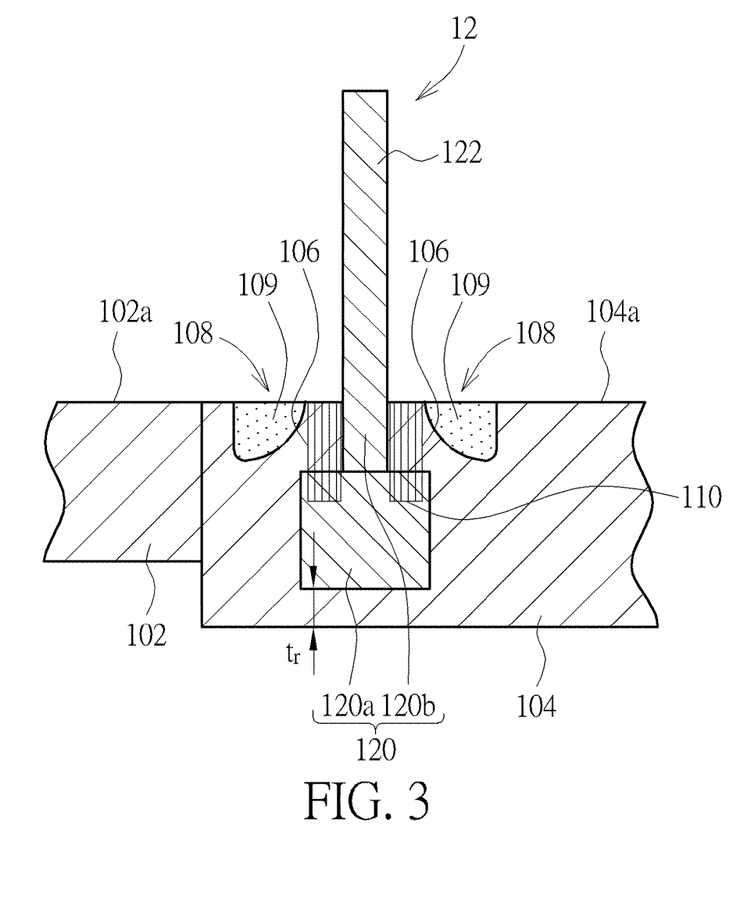
FIG. 3 is an enlarged view showing a germane portion of the current sensing resistor according to another embodiment of the invention.

FIG. 3 is an enlarged view showing a germane portion of the current sensing resistor according to another embodiment of the invention. As shown in FIG. 3, according to one embodiment of the invention, a weld joint 110 may be situated between the base 120 and extrusion portion 106. For example, the weld joint 110 may be a laser weld joint. By providing the weld joint 110 and using the laser welding, the damages at the interface between the base 120 and extrusion portion 106 may be repaired and the contact resistance may be reduced.

FIG. 4 to FIG. 8 are schematic diagrams showing a method for fabricating a current sensing resistor according to one embodiment of the invention, wherein like numeral numbers designate like elements, regions or layers.

Figure 4:
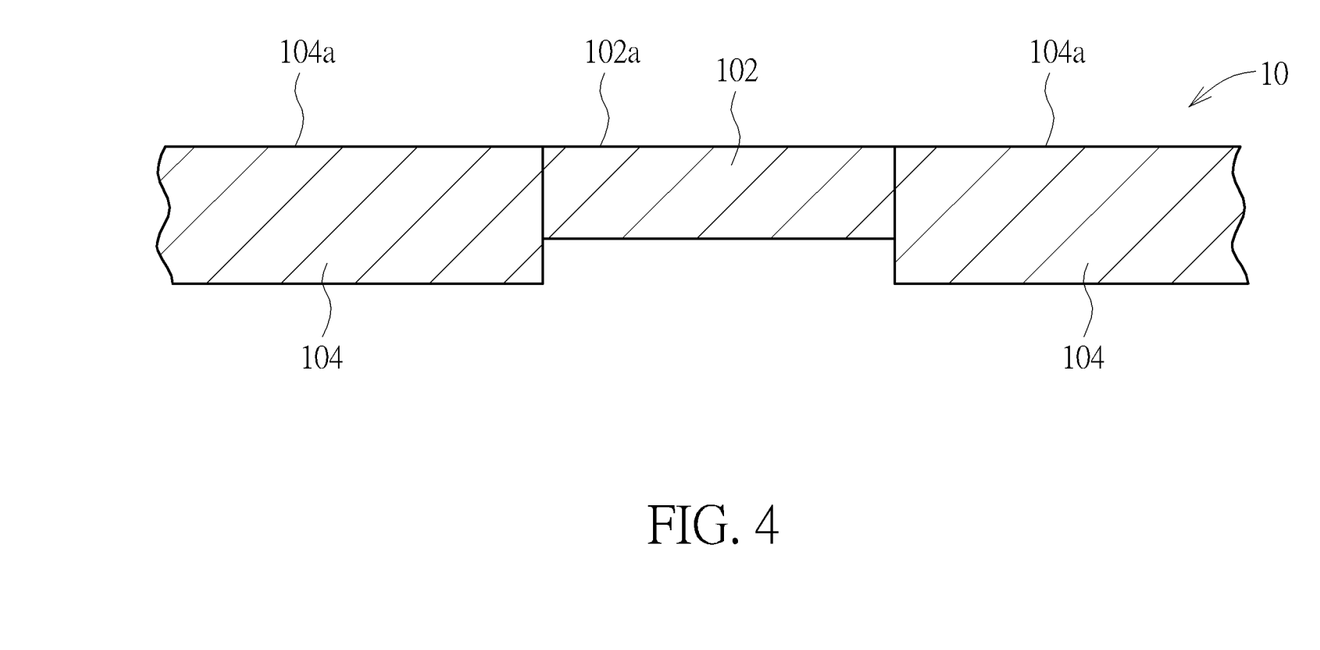
FIG. 4 to FIG. 8 are schematic diagrams showing a method for fabricating a current sensing resistor according to one embodiment of the invention.

First, as shown in FIG. 4, a conductive body 10 is provided. The conductive body 10 includes a resistor portion 102 and a pair of electrode portions 104. The resistor portion 102 is situated between the pair of electrode portions 104, and each of the pair of electrode portions 104 has a top surface 104a.

Figure 5:
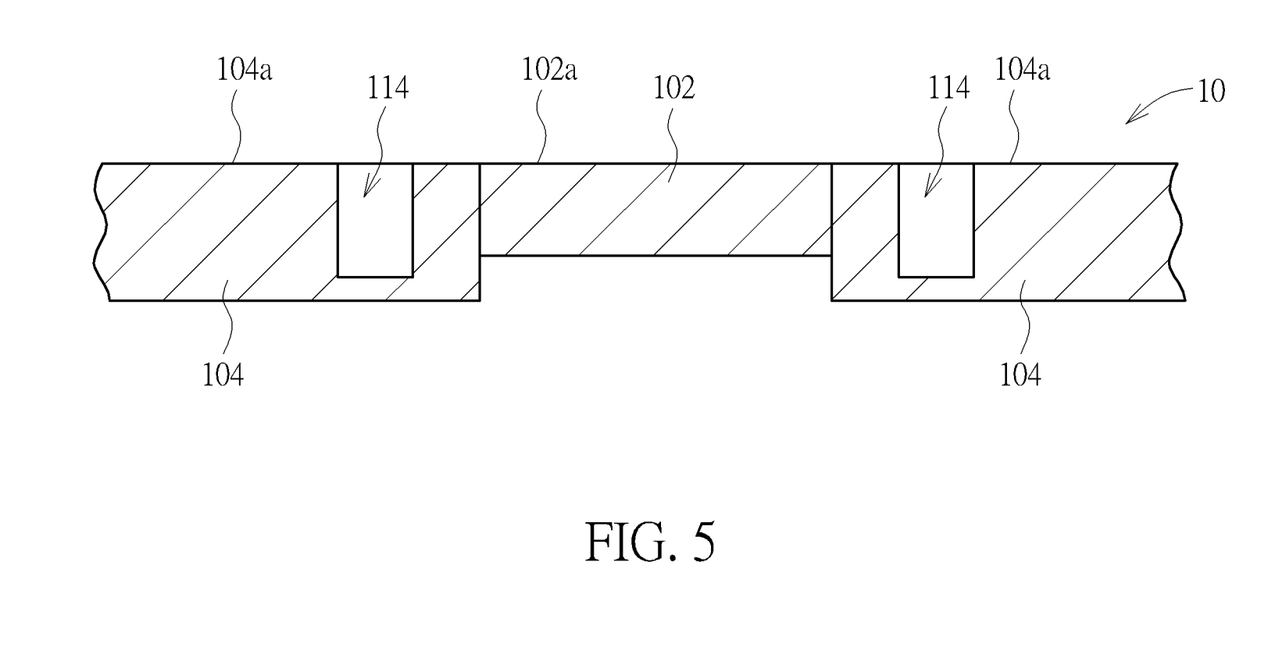

As shown in FIG. 5, a receiving blind hole 114 is formed on the top surface 104a of each of the pair of electrode portions 104. The receiving blind hole 114 may be formed by laser drilling, mechanical drilling, or any suitable methods known in the art.

Figure 6:
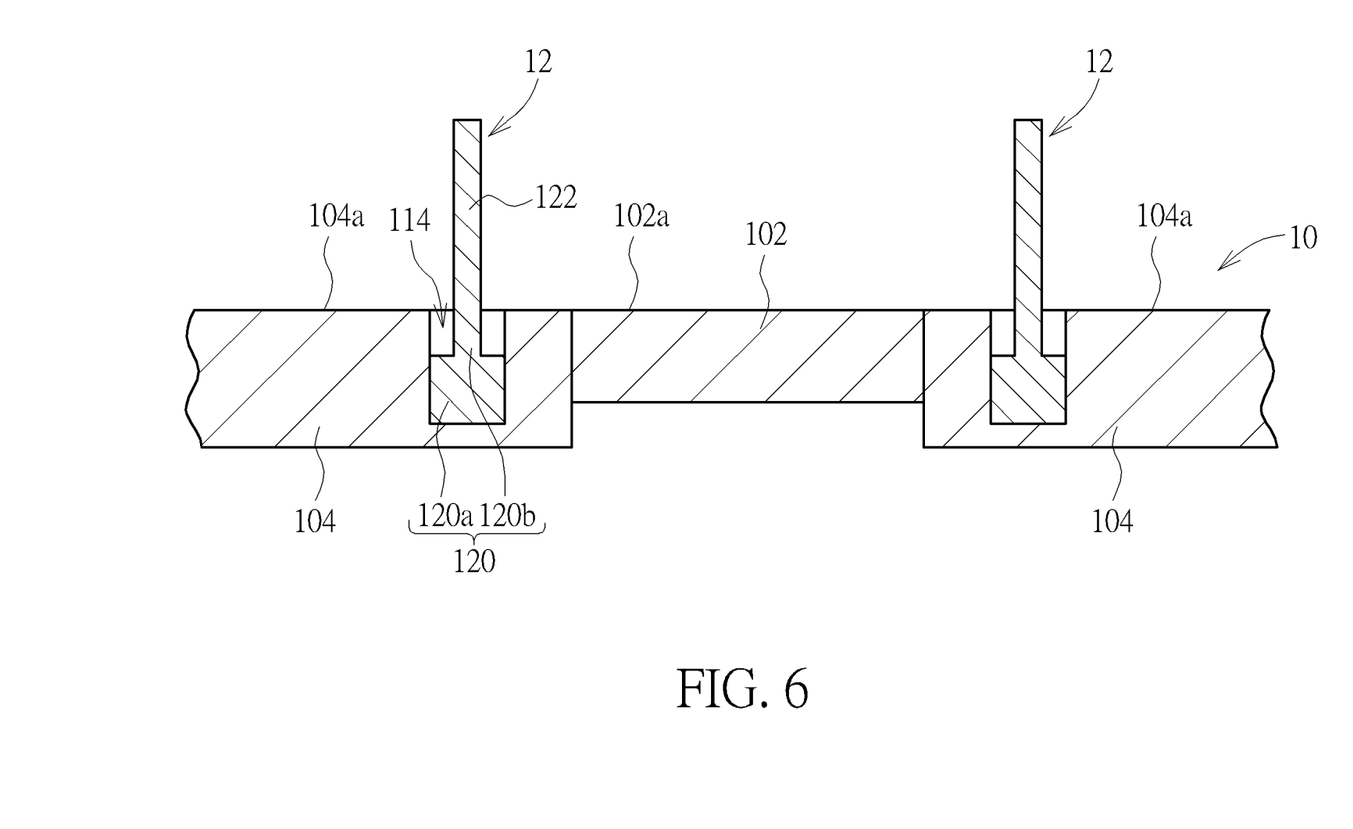

As shown in FIG. 6, a detection terminal 12 such as a copper pin is then inserted into the receiving blind hole 114. The detection terminal 12 includes a base 120 fitted in the receiving blind hole 114 and a terminal pin 122 protruding from the top surface 104a. The base 120 comprises a head portion 120a and a neck portion 120b between the terminal pin 122 and the head portion 120a. The head portion 120a has a diameter greater than that of the neck portion 120b.

Figure 7:
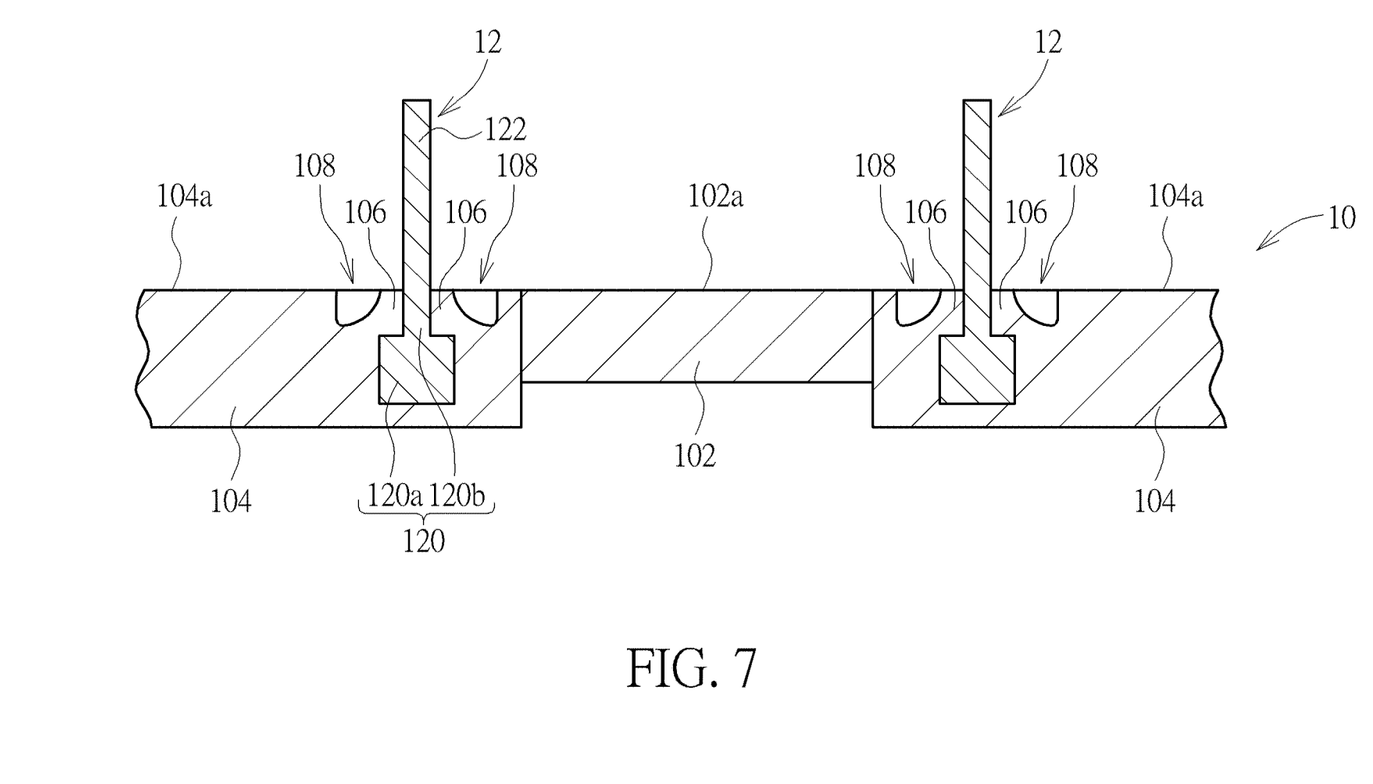

As shown in FIG. 7, each of the pair of electrode portions 104 around the terminal pin 122 is punched to form an extrusion portion 106 encircling the neck portion 120b. The extrusion portion 106 clamps the head portion 120a and the neck portion 120b and closely fixes the base 120 in the receiving blind hole 114. An annular recessed region 108 is formed around the extrusion portion 106.

Figure 8:
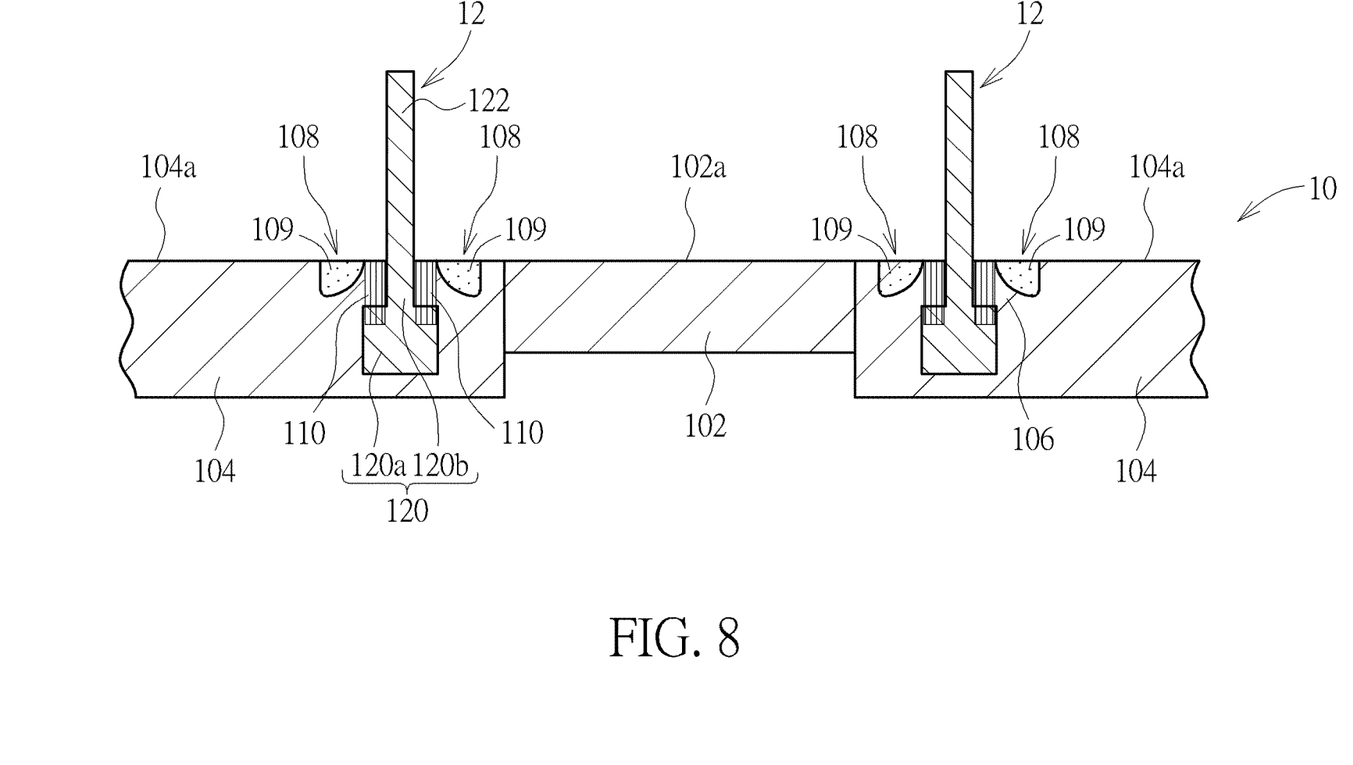

As shown in FIG. 8, the annular recessed region 108 is filled with a filler 109. According to one embodiment of the invention, the filler 109 may comprise solder, but is not limited thereto. Optionally, a welding process may be performed to form a weld joint 110 between the base 120 and the extrusion portion 106. For example, the weld joint 110 may be a laser weld joint. By providing the weld joint 110 and using the laser welding, the damages at the interface between the base 120 and extrusion portion 106 may be repaired and the contact resistance may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current sensing resistor, comprising:
   a conductive body comprising a resistor portion and a pair of electrode portions, wherein the resistor portion is situated between the pair of electrode portions, and each of the pair of electrode portions has a top surface;
   a receiving blind hole disposed on the top surface of each of the pair of electrode portions, wherein the receiving blind hole has a bottom; and
   a detection terminal disposed on the receiving blind hole, wherein the detection terminal comprising a base fixed in the receiving blind hole and a terminal pin protruding from the top surface, and the base is above the bottom, wherein the conductive body further comprises an extrusion portion extending from each of the pair of electrode portions and the extrusion portion fixes the base in the receiving blind hole.

2. The current sensing resistor according to claim 1, wherein the base comprises a head portion and a neck portion between the terminal pin and the head portion, wherein the head portion has a diameter greater than that of the neck portion.

3. The current sensing resistor according to claim 1, wherein the resistor portion has two opposite end surfaces, and the pair of electrode portions connect to the two opposite end surfaces.

4. The current sensing resistor according to claim 2, wherein the extrusion portion covers a part of the head portion to fix the base in the receiving blind hole.

5. The current sensing resistor according to claim 2, wherein the extrusion portion encircles the neck portion.

6. The current sensing resistor according to claim 1, wherein the conductive body further comprises an annular recessed region around the extrusion portion.

7. The current sensing resistor according to claim 6 further comprising:
   a filler filling into the annular recessed region.

8. The current sensing resistor according to claim 7, wherein the filler comprises solder.

9. The current sensing resistor according to claim 1, wherein a thickness of the pair of electrode portions is greater than that of the resistor portion.

10. The current sensing resistor according to claim 4, wherein the extrusion portion comprises an upper surface that includes a raised surface that is upwardly tapered toward the neck portion.

11. The current sensing resistor according to claim 4, wherein the extrusion portion comprises an upper surface that includes a concave surface.

12. The current sensing resistor according to claim 4, wherein the extrusion portion comprises an upper surface that includes a non-smooth surface.

13. The current sensing resistor according to claim 4 further comprising:
   a weld joint situated between the base and extrusion portion.

14. The current sensing resistor according to claim 1, wherein the detection terminal comprises copper.

15. The current sensing resistor according to claim 1, wherein the detection terminal has a hardness greater than that of each of the pair of electrode portions.

16. The current sensing resistor according to claim 1, wherein the base is in contact with the bottom.

17. A method for fabricating a current sensing resistor, comprising:
   providing a conductive body comprising a resistor portion and a pair of electrode portions, wherein the resistor portion is situated between the pair of electrode portions, and each of the pair of electrode portions has a top surface;
   forming a receiving blind hole on the top surface of each of the pair of electrode portions;
   inserting a detection terminal into the receiving blind hole, wherein the detection terminal comprising a base fitted in the receiving blind hole and a terminal pin protruding from the top surface, wherein the base comprises a head portion and a neck portion between the terminal pin and the head portion; and
   punching each of the pair of electrode portions around the terminal pin to form an extrusion portion encircling the neck portion, wherein the extrusion portion clamps the head portion and the neck portion and fixes the base in the receiving blind hole.

18. The method according to claim 17, wherein the head portion has a diameter greater than that of the neck portion.

19. The method according to claim 17 further comprising:
   forming an annular recessed region around the extrusion portion.

20. The method according to claim 19 further comprising:
   filling a filler into the annular recessed region.

21. The method according to claim 17 further comprising:
   performing a welding process to form a weld joint between the base and the extrusion portion.

22. The current sensing resistor according to claim 1, wherein each of the pair of electrode portions has a remaining thickness at the bottom of the receiving blind hole, and a thickness of each of the pair of electrode portions is equal to combination of the remaining thickness and a depth of the receiving blind hole.

* * * * *